United States Patent [19]

McClure et al.

[11] Patent Number: 5,774,318
[45] Date of Patent: Jun. 30, 1998

[54] I.C. POWER SUPPLY TERMINAL PROTECTION CLAMP

[75] Inventors: Steven W. McClure, Playa Del Rey; Lloyd F. Linder, Agoura Hills, both of Calif.

[73] Assignee: Raytheon Company, Lexington, Mass.

[21] Appl. No.: 753,647

[22] Filed: Nov. 27, 1996

[51] Int. Cl.$^6$ ................................................. H02H 9/00
[52] U.S. Cl. ........................................... 361/56; 361/111
[58] Field of Search .................................. 361/18, 54, 56, 361/58, 91, 111, 117–119, 126, 127

[56] References Cited

U.S. PATENT DOCUMENTS 5,463,520  10/1995  Nelson ........................................ 361/56

OTHER PUBLICATIONS

R. Dorf, *The Electrical Engineering Handbook*, CRC Press, Inc., 1993, pp. 132–136. No Month.

Horowitz and Hill, *The Art of Electronics*, Cambridge University Press (1989), pp. 318–320. No Month.

Morgan and Board, *An Introduction to Semiconductor Microtechnology*, John Wiley and Sons, Ltd. 1990, pp. 151–153. No Month.

*Primary Examiner*—Ronald W. Leja
*Attorney, Agent, or Firm*—Leonard A. Alkov; Glenn H. Lenzen, Jr.

[57] ABSTRACT

A power supply terminal clamping circuit for use in an integrated circuit protects positive and negative voltage power supply terminals from both overvoltage and ESD events. A diode stack is connected between a protected power supply terminal and ground, with the number of diodes in the stack establishing a clamping voltage. The stack becomes forward-biased when the voltage on the protected terminal reaches the clamping voltage, which triggers a switch that provides a current path between the terminal and ground that clamps the terminal voltage. A bipolar transistor embodiment includes a diode stack made from diode-connected bipolar transistors and a bipolar Darlington pair switch.

26 Claims, 3 Drawing Sheets

I.C. POWER SUPPLY TERMINAL PROTECTION CLAMP

BACKGROUND OF THE INVENTION

1. Field of the Invention

This invention relates to the field of voltage clamps, and particularly to clamps implemented in integrated circuits for protecting power supply terminals.

2. Description of the Related Art

An integrated circuit typically contains a number of components that are highly susceptible to damage from either an electrostatic discharge (ESD), referred to as an ESD "event", or an overvoltage condition. ESD events can subject an unprotected I.C. terminal to voltages in excess of 1000 volts, in either a positive or negative direction. ESD or overvoltage conditions can occur on an I.C.'s signal or power supply terminals, and can cause catastrophic damage via either route. Some form of protection is usually provided in an I.C. to reduce the likelihood of damage due to either cause. Many types of clamp circuits have been developed to provide such protection; such circuits are discussed, for example, in R. Dorf, *The Electrical Engineering Handbook*, CRC Press, Inc. (1993), pp. 132–136.

FIG. 1a shows a type of diode clamping circuit commonly used to protect the signal terminals of an integrated circuit. A signal terminal 10 is connected to the anode of a first diode D1 whose cathode is connected to a power supply terminal 12 and to the cathode of a second diode D2 whose anode is connected to a power supply terminal 14. Terminal 12 is typically connected to a positive supply, designated $V_{cc}$, and terminal 14 to an absolute negative or grounded return line, designated GND. The signal terminal 10 is clamped when either D1 or D2 becomes forward-biased. A typical I.C. diode becomes forward-biased at a voltage of about 0.7 volts. Thus, if signal terminal 10 reaches a voltage of about $V_{cc}$+0.7 volts, diode D1 becomes forward-biased and the voltage on signal terminal 10 is prevented from going any higher. Similarly, diode D2 prevents the voltage on signal terminal 10 from dropping below about GND–0.7 volts.

The clamp in FIG. 1a is activated whenever a voltage exceeds a particular threshold, and is therefore useful to protect a signal terminal from either an overvoltage condition or an ESD. However, this clamp is typically unusable to protect power supply terminals, since the clamp requires the availability of voltages that are respectively higher and lower than the nominal voltages of the positive and negative terminals to be protected. For example, the $V_{cc}$ terminal cannot be protected from voltages higher than $V_{cc}$ because there is no alternate path for discharging the higher voltage.

One circuit which has been used to protect power supply terminals in an integrated circuit is shown in FIG. 1b. The collector of a first npn bipolar transistor Q1 is connected to $V_{cc}$ terminal 12, and its base and emitter are connected to power supply return line terminal 14 (at GND) through a resistor R1. The junction capacitance of transistor Q1 together with resistor R1 form a differentiator, which causes the voltage at the node 20 between Q1 and R1 to vary in accordance with the rate of change of the voltage on terminal 12, with a faster rise-time resulting in a higher node voltage. The base of a second npn bipolar transistor Q2 is connected to node 20, and its collector and emitter are connected to $V_{cc}$ and GND, respectively. If the voltage at terminal 12 changes at a rate fast enough to cause the voltage between the base and emitter of Q2 to exceed the transistor turn-on level of about 0.7 volts, Q2 conducts and the voltage at terminal 12 is prevented from increasing any further.

The circuit of FIG. 1b suffers from a serious drawback. Since the base-emitter voltage of Q2 is dependent upon the rise-time of the voltage on terminal 12, a voltage that increases too slowly results in a voltage at node 20 which is too low to turn on Q2. An ESD event often exceeds 1000 volts, and the failure of Q2 to turn on would normally cause components connected to $V_{cc}$ to be damaged. This circuit is thus inadequate as a general overvoltage protection circuit.

Another approach taken to provide overvoltage and ESD protection on power supply terminals is shown in FIG. 1c. A zener diode Z1 is connected in series with a current limiting resistor R2 between $V_{cc}$ and ground. This circuit prevents $V_{cc}$ from exceeding the reverse breakdown voltage of Z1. However, zener diodes are frequently impractical in an integrated circuit. Processing steps that might otherwise be unneeded may be required to fabricate a zener, and a precise breakdown voltage may be difficult to obtain. The use of zener diodes in power supply clamping circuits is discussed, for example, in Horowitz and Hill, *The Art of Electronics*, Cambridge University Press (1989), pp. 318–320.

A need thus exists for a clamp circuit that is easily implemented in an integrated circuit, and which protects power supply terminals from both slow rising overvoltage conditions and ESD events.

SUMMARY OF THE INVENTION

A power supply terminal clamping circuit for use in an integrated circuit is presented which satisfies these needs. The clamp is effective for both overvoltage and ESD events, protects both positive and negative voltage power supply terminals, and generally requires no additional I.C. processing steps to implement.

The clamping circuit has two primary components: a diode "stack" connected between a power supply terminal and a ground terminal which becomes forward-biased when the voltage across the stack is sufficient to forward-bias all of its diodes, and a switch which provides a current path between the protected terminal and ground and is turned on when the stack becomes forward-biased. The diode stack becomes forward-biased when a "clamping voltage" is reached, at which time the switch is turned on and the protected terminal is prevented from exceeding the clamping voltage.

The diode stack comprises a number of series-connected diodes, with the clamping voltage equal to the sum of the voltages required to forward-bias each diode in the stack. A particular clamping voltage is chosen by including an appropriate number of diodes in the stack.

The switch is preferably implemented with a transistor circuit. When connected to an appropriate inter-diode node, the transistor circuit is turned on when the diode stack becomes forward-biased. A Darlington pair is preferred to enhance the clamp's current-carrying capacity.

The clamp is particularly suited for integrated circuits with similar devices all made via the same process, such as an I.C. with a large number of bipolar transistors. For this application, the diode stack is formed from diode-connected bipolar transistors which turn on a transistor switch when forward-biased, making an all-bipolar transistor clamp. Since the clamp's transistors are fabricated at the same time as the other transistors on the I.C., no additional processing steps are required. The switch carries most of the current when the clamp is active, allowing the stack transistors to be small and occupy very little area on the I.C. die. A separate diode stack and switch would be used for each power supply terminal.

Further features and advantages of the invention will be apparent to those skilled in the art from the following detailed description, taken together with the accompanying drawings.

DETAILED DESCRIPTION OF THE INVENTION

Figure 1A:
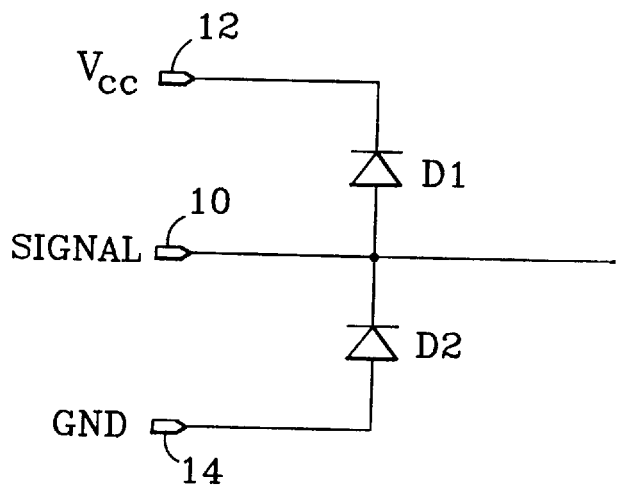
FIGS. 1a, 1b and 1c are schematic diagrams of known clamping circuits.
Figure 1B:
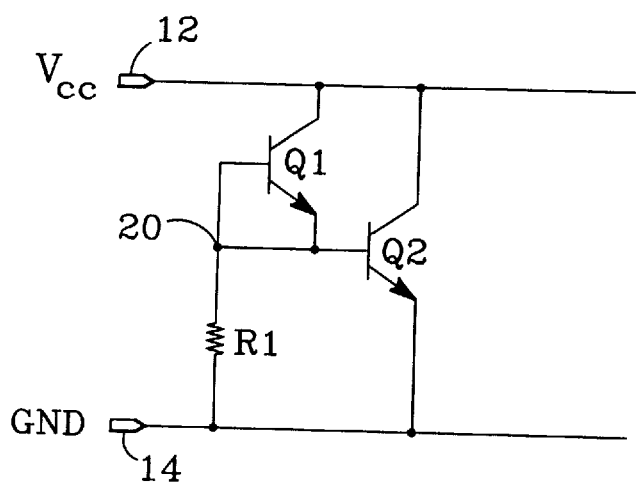
Figure 1C:
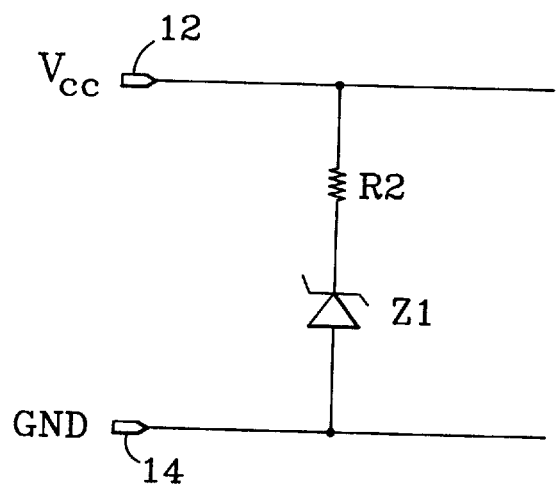
Figure 2:
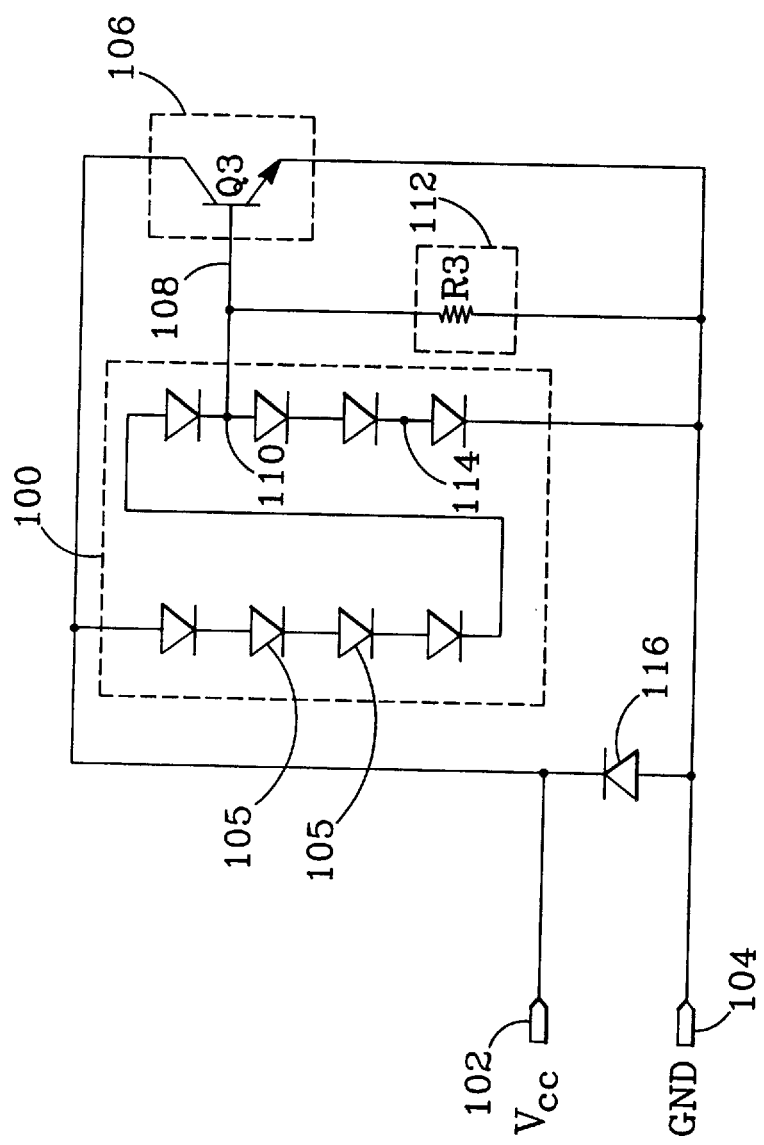
FIG. 2 is a schematic diagram of a first embodiment of a power supply terminal protection clamp per the present invention.

In FIG. 2 a diode stack 100 is shown connected between a $V_{cc}$ power supply terminal 102 and a ground (GND) terminal 104, which could alternately be connected to a negative voltage supply. The diode stack 100 is formed from series-connected diodes 105 which conduct current from the $V_{cc}$ terminal 102 to the GND terminal 104 when forward-biased; the voltage required to forward-bias the stack is its clamping voltage, which is established by the number of diodes in the stack. For the eight-diode stack shown in FIG. 2, for example, the clamping voltage is about 5.6 volts, assuming a typical voltage drop of 0.7 volts for each diode (8×0.7=5.6 volts). A "diode" refers to any device which does not conduct current when the voltage drop across it is less than a particular threshold, and does conduct current when the threshold is exceeded, as in the case of conventional diodes such as diode-connected transistors.

A clamp made from a diode stack alone will have a low current-carrying capacity unless high-power diodes are used, but these can occupy a prohibitive amount of space on an I.C. die. To increase the clamp's current-carrying capacity, a switch 106 is connected between the protected terminal 102 and the ground terminal 104 and is triggered to conduct current when the stack 100 is forward-biased. The switch has a control input 108 which controls a current circuit connected between the $V_{cc}$ and GND terminals. A suitable switch 106 comprises an npn transistor Q3 which has its base (control input) connected to an inter-diode node 110 in the diode stack, and its collector and emitter (current circuit) connected to the $V_{cc}$ terminal 102 and the GND terminal 104, respectively. An npn transistor's current circuit is triggered to conduct current when its base-emitter junction becomes forward-biased, which typically occurs when its base-emitter voltage ($V_{be}$) is about 0.7 volts.

When the voltage across the stack 100 is less than the clamping voltage, none of its diodes are forward-biased. In this state, the diodes act as resistors with very high resistance values which are not precisely known, so that the voltage at the inter-diode nodes is also not accurately known. To ensure that switch 106 is turned off when the stack is not forward-biased, a resistance 112, preferably a resistor R3, is connected between the inter-diode node 110 and the GND terminal 104 and in parallel with the diodes 105 between node 110 and the GND terminal. Resistance 112 is selected to be small in comparison with the high resistance of the diodes, i.e., less than 20 kΩ, so that it dominates the parallel combination, resulting in nearly all of the voltage on the $V_{cc}$ terminal being dropped across the diodes above the node 110, and a node 110 voltage that is nearly zero. For example, an R3 value of about 2 kΩ is suitable in connection with an eight diode stack in which npn transistor Q3 serves as switch 106, since this resistance keeps Q3's $V_{be}$ well below its trigger voltage. A resistor is preferably used to provide resistance 112 because a resistor is generally the simplest and smallest device available on an I.C. die capable of supplying a sizable resistance. Other devices, such as MOSFETs, could also be used to provide the necessary resistance 112.

When the diode stack 100 becomes forward-biased, the voltage at node 110 and control input 108 becomes equal to the number of diodes between the GND terminal 104 and the node 110 multiplied by the voltage drop across each forward-biased diode. For the clamp shown in FIG. 2, this results in a $V_{be}$ of about 2.1 volts (3 diodes×0.7 volts) for transistor Q3, which triggers Q3 to provide a current path between the $V_{cc}$ terminal 102 and the GND terminal 104.

The devices used to form the diode stack 100 are preferably fabricated as small as possible due to the large number of devices which are required to create a useful clamping voltage; this small diode size results in a very low current flow through the forward-biased stack which will generally be insufficient to hold the voltage of the protected pin at the clamping voltage. This is remedied by including switch 106, which preferably is large enough to carry at least 25 times more current than does the stack 100. A greater current capacity switch 106 requires a greater die area, however. For example, one implementation of the clamp includes a switch 106 which comprises a single transistor Q3 that occupies about 10,125 square microns of die area and is rated to carry about 64 ma steady-state, and a diode stack 100 in which each diode occupies about 1,313 square microns and is rated to carry about 1.2 ma steady-state.

The clamp described above is activated whenever the voltage on a protected terminal reaches a certain level, regardless of the voltage's rise-time. As such, it is effective as an overvoltage protection circuit which protects $V_{cc}$ from both excessive positive voltage excursions and positive high-voltage ESD events.

It is not essential that the switch 106 be connected to the node that is three diodes above the GND terminal. Any inter-diode node that will be at a voltage sufficient to turn on the switch 106 when the stack is forward-biased is acceptable. If npn transistor Q3 serves as switch 106, connecting the base of the transistor to the node 114 which is one diode above GND terminal 104 is not recommended, since Q3's $V_{be}$ would only be about 0.7 volts with the stack 100 forward-biased, which is too low to guarantee that Q3 will turn on.

It is not essential that a transistor circuit be used for switch 106. Other devices that function as a switch which is turned on and off by varying the voltage at a control input may also work, such as an analog switch or a mechanical relay, for example. The purpose of the clamp is to protect the circuit to which it is connected; as such the switch should, when triggered, provide a path between $V_{cc}$ and ground which has an impedance that is lower than any other such path in the circuit. Other factors that should be considered include the switch's response time and current-carrying capacity. For example, the "Human Body Model" ESD event characterizes a typical ESD from a human as a 100 pf capacitance discharging 2000–4000 volts through 1.5 kΩ; these values produce an event duration of about 150 ns. In designing the clamp to handle this event, the current circuit of the switch must be able to safely handle 2 amps for 150 ns for the clamp to provide effective protection. A quick response time is also important to prevent sharp transients from damaging the I.C.

before the switch is turned on and the terminal voltage becomes clamped. A transistor circuit is preferred as a switch 106 because it has a low on-resistance, typically less than 30 Ω, and can be fabricated along with other transistors on an I.C.. Other types of switches may require additional processing steps or off-chip connections.

A diode 116 is preferably included in the clamp circuit to protect the GND terminal from excessive positive excursions. The diode 116 is connected between the GND terminal 104 and the $V_{cc}$ terminal 102 so that it becomes forward-biased and clamps the GND terminal whenever the GND terminal is at a voltage equal to or greater than $V_{cc}$ plus one "diode drop", which is the voltage at which the diode becomes forward-biased. With a typical forward-bias voltage of about 0.7 volts as described above, diode 116 prevents the GND terminal from exceeding about $V_{cc}$+0.7 volts.

A clamp as shown in FIG. 2 could also be implemented to protect a power supply terminal that is at a negative voltage with respect to the GND terminal. For this application, the diode stack is connected between the GND terminal and the negative supply terminal so that it becomes forward-biased when the negative voltage terminal exceeds a negative clamping voltage established by the number of diodes in the stack.

Transistors are often used in an integrated circuit to provide the functionality of other devices, such as diodes, capacitors and resistors. This is because transistors often occupy less space than their conventional counterparts, and because it is desirable to fabricate an I.C. with as few processing steps as possible. A "bipolaronly" process, for example, produces an I.C. with a number of bipolar transistors, which are then interconnected as needed to realize a particular circuit function.

Figure 3:
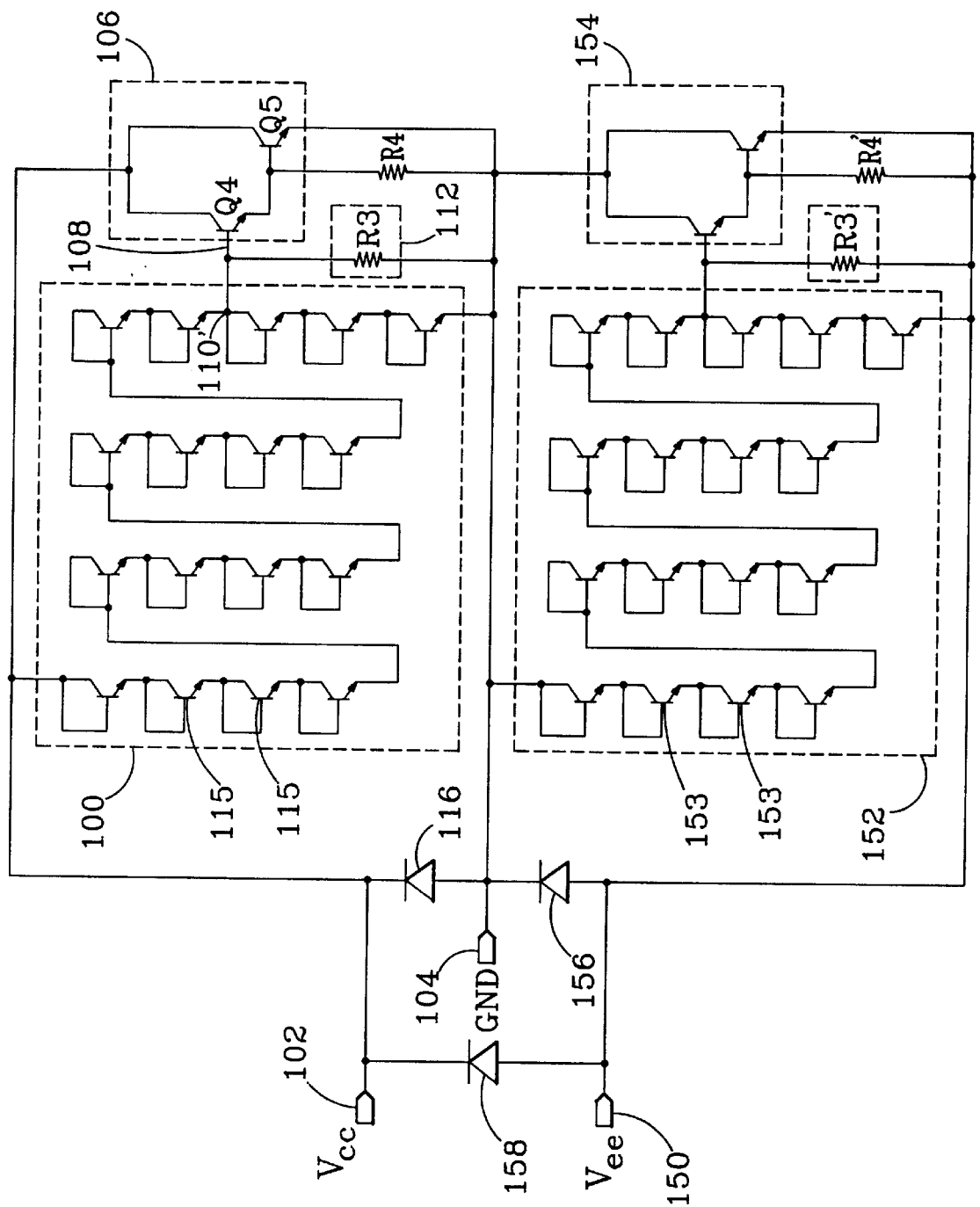
FIG. 3 is a schematic diagram of a second embodiment of a power supply terminal protection clamp per the present invention.

An embodiment of the invention which is comprised almost entirely of transistors and which provides protection for both positive and negative power supply terminals is shown in FIG. 3. By connecting the collector and base of a bipolar transistor together, a low forward impedance "diode-connected transistor" is created which functions as a diode. Seventeen diode-connected transistors 115 are connected in series between $V_{cc}$ terminal 102 and GND terminal 104 to form diode stack 100, which conducts current between $V_{cc}$ and GND when forward-biased. A diode stack of this size results in a clamping voltage of about 11.9 volts (17×0.7 volts). Other clamping voltage values are obtained by fabricating the clamp with more or fewer diode-connected transistors. Enough diodes should be used to insure that the clamping voltage is at least as high as the nominal voltage on the protected power supply terminal. For example, if $V_{cc}$ is nominally +15 volts, the diode stack should include enough diodes to create a clamping voltage of at least 15 volts; at 0.7 volts per diode, at least 22 diodes would be needed.

Switch 106 is preferably implemented as a Darlington pair comprising bipolar transistors Q4 and Q5. The base of transistor Q4 serves as the switch's control input 108 and is connected to inter-diode node 110'. The emitter of transistor Q4 is connected to the base of transistor Q5, whose emitter is connected to the GND terminal 104. The collectors of Q4 and Q5 are tied together and connected to the $V_{cc}$ terminal 102. A Darlington pair is preferred over a single transistor because the pair offers a higher gain and thus a faster turn-on time, as well as a higher collector impedance which results in a lower leakage current. When a Darlington pair is used, connection to a node which is at least three diode-connected transistors above the GND terminal is recommended to insure that both transistors Q4 and Q5 turn on when the stack is forward-biased, since the base voltage of Q5 will be one $V_{be}$ drop below the base voltage of Q4.

As with the clamp shown in FIG. 2, resistance 112 prevents transistor Q4 from being switched on when the stack is not forward-biased. A resistor R4, preferably about 2 kΩ, is connected between the base of transistor Q5 and the GND terminal to provide the same function for Q5.

A similar clamp is used to protect a negative power supply terminal 150 which is connected to a nominal voltage $V_{ee}$ that is negative with respect to the GND terminal; it includes a diode stack 152 and a switch 154, and resistors R3' and R4' corresponding to resistors R3 and R4 in the positive supply clamp. The stack is connected to conduct current between the GND terminal and the $V_{ee}$ terminal when forward-biased, which prevents the $V_{ee}$ terminal from exceeding a negative clamping voltage established by the number of diode-connected transistors 153 in the stack 152.

As in the clamp circuit shown in FIG. 2, diode 116 is connected between GND terminal 104 and $V_{cc}$ terminal 102 to prevent the voltage on the GND terminal from going any higher than about $V_{cc}$ plus one diode drop. A diode 156 is preferably connected between the GND terminal 104 and the $V_{ee}$ terminal 150 to protect the GND terminal from excessive negative excursions; diode 156 prevents the voltage on the GND terminal from going any lower than about $V_{ee}$ minus one diode drop.

A diode 158 is preferably connected so that it conducts current from the $V_{ee}$ terminal 150 to the $V_{cc}$ terminal 102 when forward-biased, to prevent $V_{cc}$ from going below $V_{ee}$ minus one diode drop, and $V_{ee}$ from going higher than $V_{cc}$ plus one diode drop.

The circuit shown in FIG. 3 thus completely safeguards circuitry connected to power supply terminals 102, 104 and 150 by providing clamping mechanisms that become active whenever any of the terminals is subjected to an overvoltage or ESD event in either a positive or negative direction.

Other power supply terminals can be similarly protected simply by adding a clamp circuit for each additional terminal, with each clamp circuit comprising a diode stack and a switch. It is not necessary that each clamp have the same clamping voltage—clamps protecting different power supply terminals may have different numbers of diodes in their respective diode stacks, and thus different clamping voltages. For example, an I.C. receiving power supply voltages of +12, -15 and -5.2 volts would include clamps using stacks of 18 diodes (clamping voltage of 12.6 volts), 22 diodes (-15.4 volts), and 8 diodes (-5.6 volts), respectively.

Other device families can be used to implement a power supply terminal protection clamp per the present invention. For example, pnp transistors, HEMTs, MESFETS or MOSFETS could be used for the diode stacks, the switches, or both.

The invention as described herein is preferably implemented in an integrated circuit, but may also be used outside of an I.C. However, some of the advantages offered by the invention are lost in a non-I.C. application in which other devices, such as zener diodes, could be used to provide the functionality of the invention's diode stack.

Techniques for fabricating integrated circuits are well-known. I.C. fabrication of bipolar transistors in particular is discussed, for example, in Morgan and Board, *An Introduction to Semiconductor Microtechnology*, John Wiley and Sons, Ltd. (1990), pp. 151–153.

While particular embodiments of the invention have been shown and described, numerous variations and alternate embodiments will occur to those skilled in the art. Accordingly, it is intended that the invention be limited only in terms of the appended claims.

We claim:

1. A power supply terminal protection clamp suitable for implementation in an integrated circuit, comprising:

first and second power supply terminals, a first stack of diode-connected bipolar transistors connected in series and connected to conduct current from said first to said second power supply terminal in response to a clamping voltage which forward-biases said transistors, and a first bipolar transistor circuit having a current circuit controlled by a control input, said control input connected to an inter-transistor node of said first stack and said current circuit connected between said first and second power supply terminals, said transistor circuit conducting current between said first and second power supply terminals when said first transistor stack becomes forward-biased.

2. The power supply terminal protection clamp of claim 1, wherein said diode-connected transistors are npn bipolar transistors.

3. The power supply terminal protection clamp of claim 1, wherein said transistor circuit comprises an npn transistor.

4. The power supply terminal protection clamp of claim 1, wherein said transistor circuit is a Darlington pair of transistors.

5. The power supply terminal protection clamp of claim 1, further comprising a resistance connected between said inter-transistor node and said second power supply terminal to maintain said node at a voltage sufficient to keep said current circuit from being triggered while said stack is not forward-biased.

6. The power supply terminal protection clamp of claim 1, wherein said transistor circuit when on provides a lower impedance path between said first and second power supply terminals than is provided by any other path between said terminals.

7. The power supply terminal protection clamp of claim 1, wherein said transistor circuit when on conducts at least 25 times more current than does said first stack when forward-biased.

8. The power supply terminal protection clamp of claim 1, wherein said first power supply terminal is normally at a positive supply voltage with respect to the supply voltage at said second power supply terminal.

9. The power supply terminal protection clamp of claim 1, further comprising a diode arranged to conduct current from said second to said first power supply terminal when forward-biased.

10. The power supply terminal protection clamp of claim 1, wherein said clamp is implemented in an integrated circuit.

11. The power supply terminal protection clamp of claim 10, wherein said clamp is implemented in an integrated circuit using a bipolar-only process.

12. The power supply terminal protection clamp of claim 1, wherein each of said diode-connected transistors and each transistor of said transistor circuit are of like conductivity.

13. A power supply terminal protection clamp suitable for implementation in an integrated circuit, comprising:

first and second power supply terminals, said first power supply terminal normally at a positive supply voltage with respect to the supply voltage at said second power supply terminal, a third power supply terminal which is normally at a negative supply voltage with respect to the supply voltage at said second power supply terminal, a first stack of series-connected diodes connected to conduct current from said first to said second power supply terminal in response to a clamping voltage which forward-biases said diodes, a second stack of series-connected diodes connected to conduct current from said second to said third power supply terminal in response to a clamping voltage which forward-biases said second stack of diodes, a first switch connected to conduct current between said first and second power supply terminals in response to said first diode stack becoming forward-biased, and a second switch connected to conduct current between said second and third power supply terminals in response to said second diode stack becoming forward-biased.

14. The power supply terminal protection clamp of claim 13, further comprising a diode arranged to conduct current from said third to said second power supply terminal when forward-biased.

15. A power supply terminal protection clamp suitable for implementation in an integrated circuit, comprising:

first and second power supply terminals, said first terminal at a nominal positive voltage with respect to said second terminal, a first stack of diode-connected transistors connected to conduct current from said first to said second power supply terminal in response to a first clamping voltage which forward-biases said diode-connected transistors, the number of diode-connected transistors in said first stack establishing said first clamping voltage at a level equal to or greater than said nominal positive voltage on said first terminal, and a transistor circuit which includes a current circuit controlled by a control input, said control input connected to an inter-transistor node of said first stack and triggering said current circuit to conduct current between said first and second power supply terminals in response to said first stack becoming forward-biased, each of the transistors in said first stack and each transistor of said transistor circuit being bipolar transistors, said first stack and said first transistor circuit being implemented in an integrated circuit.

16. The power supply terminal protection clamp of claim 15, wherein said integrated circuit is fabricated with a bipolar-only process.

17. The power supply terminal protection clamp of claim 15, wherein said transistor circuit comprises a Darlington pair which is turned on when said stack becomes forward-biased and is off when said stack is not forward-biased.

18. The power supply terminal protection clamp of claim 15, wherein said transistor circuit when on provides a lower impedance path between said first and second power supply terminals than is provided by any other path between said terminals.

19. The power supply terminal protection clamp of claim 15, wherein said transistor circuit when on conducts at least 25 times more current than does said first stack when forward-biased.

20. The power supply terminal protection clamp of claim 15, further comprising a diode arranged to conduct current from said second to said first power supply terminal when forward-biased to prevent the voltage at said second terminal from exceeding the voltage at said first terminal plus one diode drop.

21. The power supply terminal protection clamp of claim 15, further comprising a resistance connected between said inter-transistor node and said second power supply terminal to maintain said node at a voltage sufficient to keep said current circuit from being triggered while said stack is not forward-biased.

22. A power supply terminal protection clamp suitable for implementation in an integrated circuit, comprising:

first and second power supply terminals, said first terminal at a nominal positive voltage with respect to said second terminal, a third power supply terminal, said third terminal at a nominal negative voltage with respect to said second terminal, a first stack of diode-connected transistors connected to conduct current from said first to said second power supply terminal in response to a first clamping voltage which forward-biases said diode-connected transistors, the number of diode-connected transistors in said first stack establishing said first clamping voltage at a level equal to or greater than said nominal positive voltage on said first terminal, a second stack of diode-connected transistors connected to conduct current from said second to said third power supply terminal in response to a second clamping voltage which forward-biases said diode-connected transistors, the number of diode-connected transistors in said second stack establishing said second clamping voltage at a level equal to or greater than said nominal negative voltage on said third terminal, a first switch with a current circuit controlled by a control input, said control input connected to an inter-transistor node of said first stack and triggering said current circuit to conduct current between said first and second power supply terminals in response to said first stack becoming forward-biased, and a second switch with a current circuit controlled by a control input, said control input connected to an inter-transistor node of said second stack and triggering said current circuit to conduct current between said second and third power supply terminals in response to said second stack becoming forward-biased, said first and second stacks and said first and second switches implemented in an integrated circuit and forming a clamp which prevents said first and third power supply terminals from exceeding said first and second clamping voltages, respectively.

23. The power supply terminal protection clamp of claim 22, further comprising a diode arranged to conduct current from said third to said second power supply terminal when forward-biased to prevent the voltage at said second terminal from exceeding the voltage at said third terminal minus one diode drop.

24. A power supply terminal protection clamp suitable for implementation in an integrated circuit, comprising:

at least three power supply terminals with a first terminal at a nominal positive voltage with respect to a second terminal and a third terminal at a nominal negative voltage with respect to said second terminal, a first stack of diode-connected transistors connected to conduct current from said first to said second power supply terminal in response to a first clamping voltage which forward-biases said diode-connected transistors, the number of diode-connected transistors in said first stack establishing said first clamping voltage at a level equal to or greater than said nominal positive voltage on said first terminal, a first switch with a current circuit controlled by a control input, said control input connected to a first inter-diode node of said first stack and triggering said current circuit to conduct current between said first and second power supply terminals in response to said first stack becoming forward-biased, said first switch comprising a Darlington pair, a second stack of diode-connected transistors connected to conduct current from said second to said third power supply terminal in response to a second clamping voltage which forward-biases said diode-connected transistors, the number of diode-connected transistors in said second stack establishing said second clamping voltage at a level equal to or greater than said nominal negative voltage on said third terminal, and a second switch with a current circuit controlled by a control input, said control input connected to a second inter-diode node of said second stack and triggering said current circuit to conduct current between said second and third power supply terminals in response to said second stack becoming forward-biased, said second switch comprising a Darlington pair, a resistance connected between said first inter-diode node and said second power supply terminal to maintain said first node at a voltage sufficient to keep the current circuit of said first switch from being triggered while said first stack is not forward-biased, and a resistance connected between said second inter-diode node and said third power supply terminal to maintain said second node at a voltage sufficient to keep the current circuit of said second switch from being triggered while said second stack is not forward-biased, said first and second diode stacks and said first and second switches implemented in an integrated circuit and forming a clamp which protects said first and third power supply terminals from exceeding said first and second clamping voltages, respectively.

25. The power supply terminal protection clamp of claim 24, further comprising a first diode arranged to conduct current from said second to said first power supply terminal when forward-biased to prevent the voltage at said second terminal from exceeding the voltage at said first terminal plus one diode drop, and a second diode arranged to conduct current from said third to said second power supply terminal when forward-biased to prevent the voltage at said second terminal from exceeding the voltage at said third terminal minus one diode drop.

26. The power supply terminal protection clamp of claim 24, further comprising a third diode arranged to conduct current from said third to said first power supply terminal when forward-biased to prevent said first terminal from becoming more negative than said third terminal minus one diode drop and to prevent said third terminal from becoming more positive than said first terminal plus one diode drop.

* * * * *